United States Patent
Klaren

(10) Patent No.: US 10,084,415 B1
(45) Date of Patent: Sep. 25, 2018

(54) FAST CHARGE FOR QUICK AMPLIFIER SETTLING

(71) Applicant: pSemi Corporation, San Diego, CA (US)

(72) Inventor: Jonathan James Klaren, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 15/686,018

(22) Filed: Aug. 24, 2017

(51) Int. Cl.
| | |
|---|---|
| *H03F 3/217* | (2006.01) |
| *H03F 1/26* | (2006.01) |
| *G06F 13/42* | (2006.01) |
| *H03F 3/19* | (2006.01) |
| *H03K 3/012* | (2006.01) |
| *H03K 19/01* | (2006.01) |
| *H04B 1/16* | (2006.01) |

(52) U.S. Cl.
CPC ........... *H03F 1/26* (2013.01); *G06F 13/4282* (2013.01); *H03F 3/19* (2013.01); *H03F 3/217* (2013.01); *H03K 3/012* (2013.01); *H03K 19/01* (2013.01); *G06F 2213/0016* (2013.01); *H03F 2200/294* (2013.01); *H03F 2200/451* (2013.01); *H04B 1/16* (2013.01)

(58) Field of Classification Search
CPC ........................................................ H03F 3/217
USPC ............................................. 330/251, 207 A
See application file for complete search history.

(56) References Cited

U.S. PATENT DOCUMENTS

| | | | |
|---|---|---|---|
| 8,319,570 B2 * | 11/2012 | Wilson | H03F 3/217 323/283 |
| 8,907,642 B1 * | 12/2014 | Burstein | H02M 3/1584 323/272 |
| 9,577,527 B2 * | 2/2017 | Trichy | H02M 3/158 |

* cited by examiner

*Primary Examiner* — Henry Choe
(74) *Attorney, Agent, or Firm* — Jacquez Land Greenhaus LLP; Martin J. Jacquez, Esq.; Alessandro Steinfl, Esq.

(57) ABSTRACT

A fast switching time is highly desired in the design of mobile handsets. The limiting factor in the switching time is the resistor through which bias is applied to amplifiers used within such handsets. Bypassing the bias resistor when amplifiers are transitioning is a way to improve switching time without compromising the RF performance. Methods and devices to generate short pulses without relying on a continuously running clock and used to bypass bias resistors are described.

32 Claims, 7 Drawing Sheets

300

FAST CHARGE FOR QUICK AMPLIFIER SETTLING

BACKGROUND

(1) Technical Field

The present disclosure is related to amplifiers, and more particularly to methods and apparatus for reducing amplifier switching time to achieve quick amplifier settling.

(2) Background

Mobile handsets frequently switch bands to adapt to available carriers in the area. In other words, Low Noise Amplifiers (LNA) associated with specific bands and used as part of such handsets are frequently turned on and off during operation. Moreover, in a wireless mobile environment and in order to adapt to varying signal strength, LNAs are also required to change gain and to switch among various gain states. In order to keep a connection live and minimize data loss, LNA switching times are desired to be fast. The longer the switching time, the less time available for utilizing the bandwidth and the communication link.

FIG. 1 shows an exemplary receiver module 100 including an LNA 120 wherein the LNA bias voltage provided by a bias voltage generator 125 is applied through series resistors Rlarge and Rsmall. In this example, it is assumed that the resistor Rlarge has a larger resistance than the resistor Rsmall. A switch S1 coupled across the resistor Rlarge is also shown in FIG. 1. FIG. 2 shows receiver module 200 which is a typical implementation of the receiver module 100 of FIG. 1, wherein LNA transistors T1 and T2 are used for amplification purpose and the switch S1 is implemented using a transistor T3.

Referring back to FIG. 1, it is known to the person skilled in the art that the limiting factor in the LNA switching time is the bias series resistance through which bias is applied to the amplifier. The smaller the series bias resistance, the faster the switching time. The reason is a faster charge and discharge of junction capacitances of the LNA transistors during transition. However, it is also known that use of larger bias resistances provides benefits such as improved linearity, higher signal gain and better bias noise isolation. Therefore, the design choice of the amplifier's series bias resistor is a matter of tradeoff between Radio Frequency (RF) performance and amplifier switching time.

With further reference to FIG. 1, one way to achieve shorter switching time without impacting RF performance is to bypass the resistor Rlarge by the switch S1 during a transition of LNA from one steady state to another. In other words, during transition, a Fast Charge One Shot (FCOS) pulse with a pulse width of duration 'T' may be applied to close the switch S1, thereby bypassing the resistor Rlarge and allowing the amplifier to stabilize to a final operating point more quickly. After the duration 'T' and when the amplifier has settled, the switch S1 will be open to allow the bias circuit to be isolated from the RF circuit during steady state operation.

In general, LNA circuits do not have their own clock and this makes the task of generating FCOS pulses as described above challenging. In fact having a continuously running clock in receiver modules such as the one shown in FIG. 1 will generate an undesired bias noise and spurious. Solutions are therefore needed for the problem of generating FCOS pulses.

SUMMARY

According to a first aspect of the present disclosure, a switching control logic is provided, comprising: a serial bus interface, the serial bus interface comprising an interface bus; a glue logic, the glue logic comprising a fast charge (FC) bus, and a fast charge pulse conditioning block (FCPCB), the FCPCB comprising a fast charge one shot (FCOS) bus; wherein: the glue logic is connected with the serial bus interface via the interface bus; the glue logic is connected with the FCPCB via the FC bus, and the FC bus is configured such that a first serial bus interface transaction will assert a signal on the FC bus, thereby generating a fast charge one shot (FCOS) pulse with a pulse width 'T1' on the FCOS bus, and a second serial bus interface transaction following the first serial bus interface transaction will de-assert the signal on the FC bus.

According to a second aspect of the present disclosure, a switching control logic is provided, comprising: (a) a serial bus interface, the serial bus interface comprising an interface bus; (b) a glue logic, the glue logic comprising a plurality of fast charge (FC) buses and a plurality of select buses; (c) a plurality of fast charge pulse conditioning blocks (FCPCB), the plurality of FCPCBs comprising a plurality of fast charge one shot (FCOS) buses, and (d) a plurality of logic blocks, the plurality of logic blocks comprising a plurality of control output buses; wherein: (e) the glue logic is connected with the serial bus interface via the interface bus; (f) the glue logic is connected with each of the plurality of FCPCBs via a corresponding FC bus of the plurality of FC buses; (g) each of the plurality of logic boxes are connected with the glue logic via a corresponding select bus of the plurality of select buses; (h) the plurality of logic boxes is connected with corresponding FCPCBs via corresponding FCOS buses; (i) the plurality of FC buses are configured such that a first serial bus interface transaction will assert signals on the plurality of FC buses, thereby generating an FCOS pulse having a pulse width within a desired pulse width range on each of the plurality of FCOS buses, and a second serial bus interface transaction following the first serial bus interface transaction will de-assert the signals on the plurality of FC buses, and (j) if a select bus of the plurality of select buses is in a TRUE state, the corresponding control logic box of the plurality of the control logic boxes is configured to pass a corresponding FCOS pulse to a corresponding control output bus of the plurality of the control output buses.

According to a third aspect of the present disclosure, a method of generating a fast charge one shot (FCOS) pulse is disclosed, providing: providing a serial bus interface; providing a fast charge (FC) bus; generating a first serial bus interface transaction; detecting the first serial bus interface transaction; asserting a signal on the FC bus upon detecting the first serial bus interface transaction; generating the FCOS pulse upon asserting the signal on the FC bus; generating a second serial bus interface transaction; detecting the second serial bus interface transaction, and de-asserting the signal on the FC bus upon detection of the second serial bus interface transaction.

Based on what described above, an accurate knowledge of time instants at which FCOS pulses need to occur, i.e. the transition time instants, is desired. Generally speaking, in LNA circuits the exact time instant at which such pulses need to occur, would not be readily available without relying on some sort of clocking activities or time reference in the circuit. The present disclosure addresses this problem and provides methods and devices to generate FCOS pulses to improve amplifier switching time in systems using such amplifiers.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION

Figure 1:
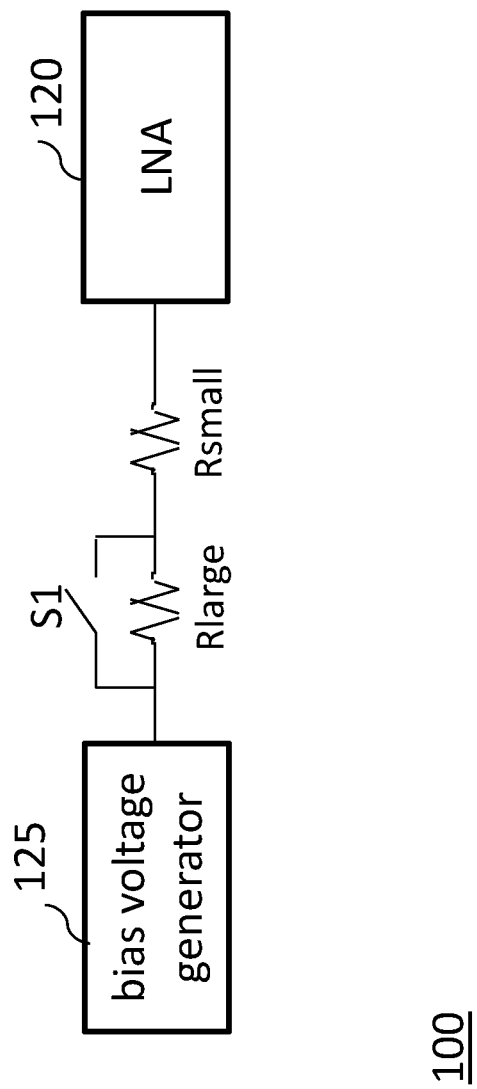
FIG. 1 shows a receiver module.
Figure 2:
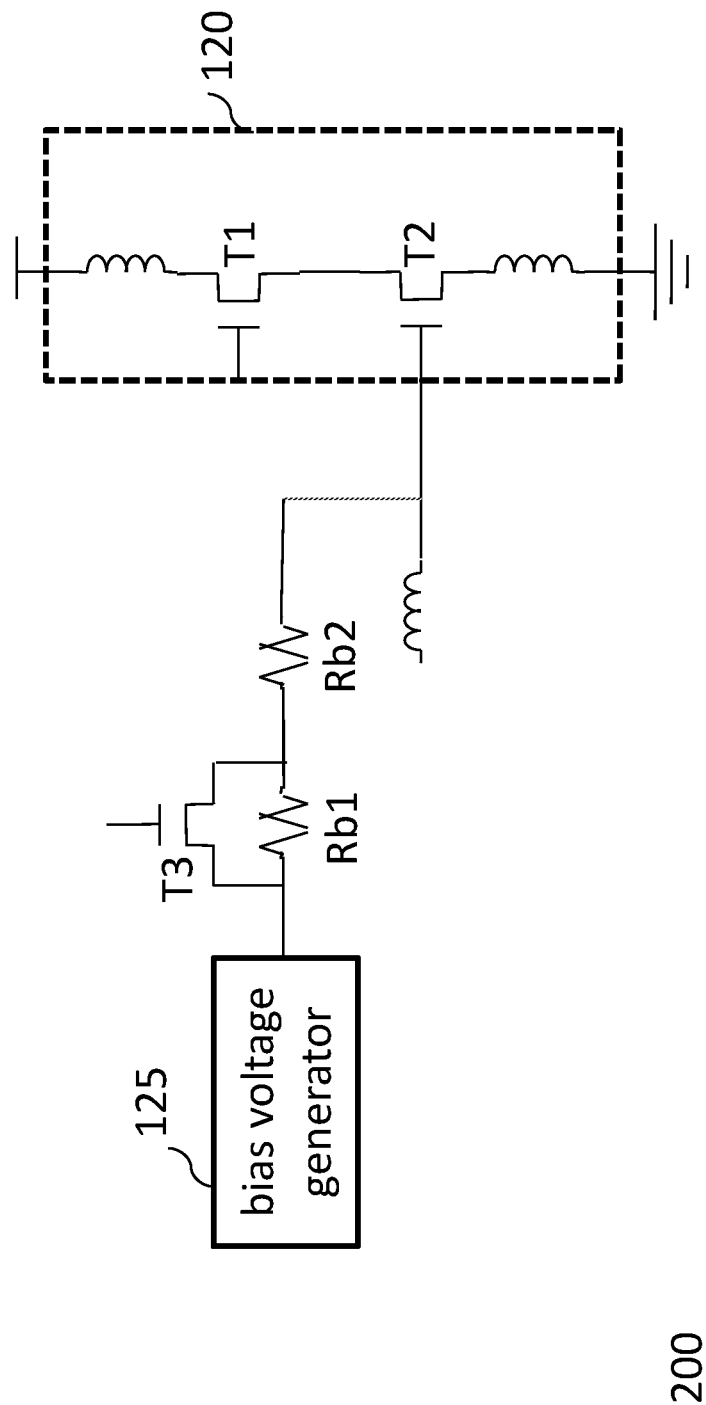
FIG. 2 shows a typical implementation of the receiver module of FIG. 1.
Figure 3:
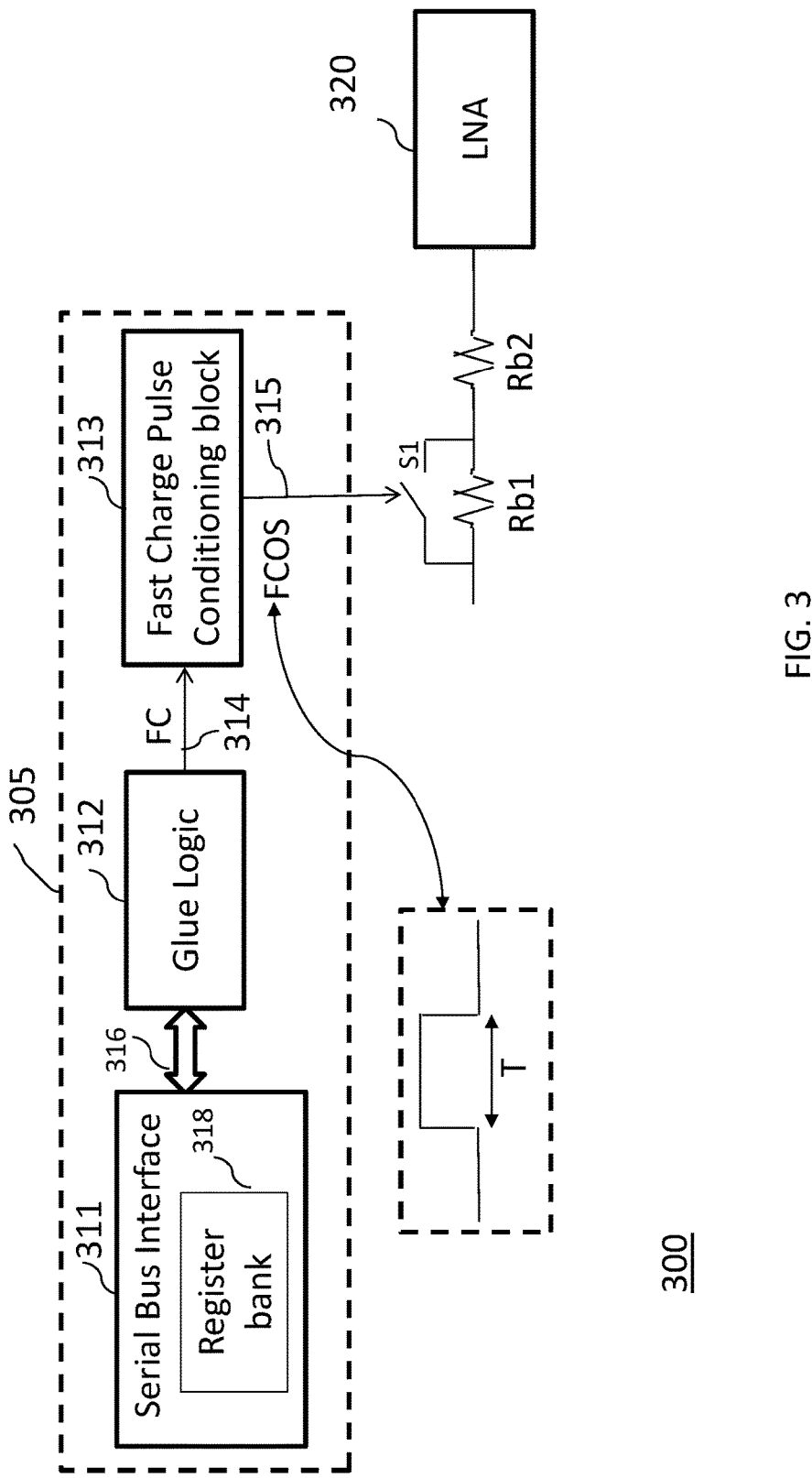
FIG. 3 shows a receiver module in accordance with an embodiment of the disclosure.

FIG. 3 shows a receiver module 300 comprising a switching control logic 305 in accordance with an embodiment of the present disclosure. The switching control logic 305 comprises a serial bus interface 311, a glue logic 312 and a fast charge pulse conditioning block (FCPCB) 313. The serial bus interface 311 comprises a register bank 318 and an interface bus 316. A glue logic is defined herewith as a custom logic circuitry used to interface a number of elements of a circuit. The glue logic 312 is connected with the serial bus interface 311 via the interface bus 316. The register bank 318 comprises a plurality of registers containing information related to an LNA 320. By way of example and not of limitation, the plurality of registers may include information related to the LNA 320 (e.g., which band(s) is active and which one(s) is not, gain state and bias state). Any transition of the LNA 320 from one state to another corresponds to a change of corresponding values of a register within the register bank.

Referring to FIG. 3 and according to an embodiment of the present disclosure, any change or transition between steady states and relevant to the LNA 320 corresponds to a serial bus interface transaction. In an operative condition, the glue logic 312 monitors values of relevant registers within the register bank 318 to detect changes indicating transitions. Upon detection of a change of a relevant register value indicating a transition, a signal on a fast charge (FC) bus 314 is asserted. As a result of such assertion, the FCPCB 313 generates an FCOS pulse having a pulse width of a desired duration 'T' on an FCOS bus 315, thereby closing the switch S1 during the transition. The signal on the FC bus 314 is then de-asserted on a next transaction of the serial bus interface 311 after which the switch control logic 305 will be ready again to detect a next upcoming serial interface bus transaction. The person skilled in the art will appreciate that according to teachings of the present disclosure, generation of FCOS pulses at desired time instants is performed based on serial bus interface transactions without relying on a continuously running reference clock. It should be emphasized that in order to avoid interference issues, serial interfaces generally do not have clocks running continuously.

With further reference to FIG. 3, the duration 'T' is within a range of 600 ns to 800 ns in accordance with an embodiment of the disclosure. Other embodiments according to the present disclosure and using different values for the duration 'T' may also be envisaged without departing from the spirit of the disclosure. In a yet another embodiment of the present disclosure, the duration 'T' may be less than 1 usec.

According to an embodiment of the present disclosure, the serial bus interface 311 of FIG. 3 is a Mobile Industry Processor Interface (MIPI)®. MIPI® is the specification of a bus interface specifically for the needs of current and future mobile wireless systems to control slaves in an RF front-end. The person skilled in the art will understand that other embodiments using different serial bus interfaces may also be envisaged without departing from the scope and spirit of the disclosure.

Figure 4:
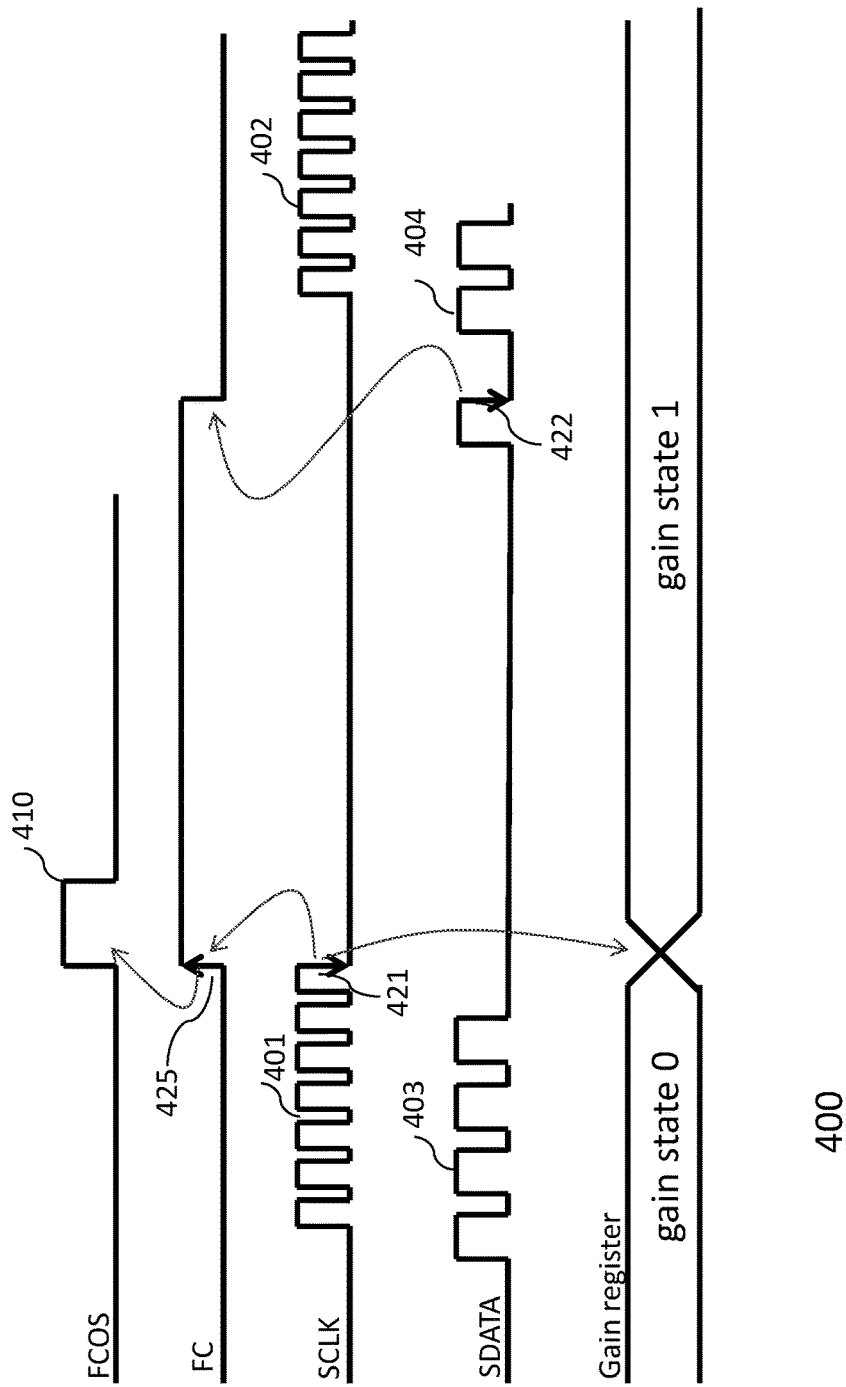
FIG. 4 shows timing diagrams associated with an embodiment in accordance with the disclosure.

FIG. 4 shows an exemplary timing diagram associated with the switching control logic 305 of FIG. 3. According to an embodiment of the present disclosure, the serial bus interface 311 of FIG. 3 may be a MIPI® comprising two buses SCLK and SDATA as shown in FIG. 4. Any relevant change in LNA states corresponds to transactions on the SCLK and/or SDATA bus. Transactions (401-404) shown in FIG. 4 are examples of such transactions. Referring to FIGS. 3-4 and moving from left to right on timing diagrams of FIG. 4, an LNA transition from gain state 0 to gain state 1 corresponds to the transaction 401. A last falling edge 421 of the transaction 401 will trigger a rising edge 425 on the FC bus 314, and as a result, an FCOS pulse 410 with the desired duration 'T' is generated. As described previously, the FCOS pulse 410 will bypass a series bias resistance Rb1 of FIG. 3 to accelerate settling time of the LNA 320. The signal on the FC bus 314 will be de-asserted with a next upcoming transaction. In other words, and referring to FIG. 4, upon a first falling edge 422 of the transaction 404, the FC bus will be de-asserted and the switching control logic 305 of FIG. 3, will be ready for a following transaction. The person skilled in the art will understand that the timing diagram of FIG. 4 serves as an exemplary demonstration of the timings according to one embodiment of the disclosure. Without departing from the spirit and the scope of the disclosure, other embodiments may be made using different transaction sequences, rising/falling edge triggers etc.

Figure 5:
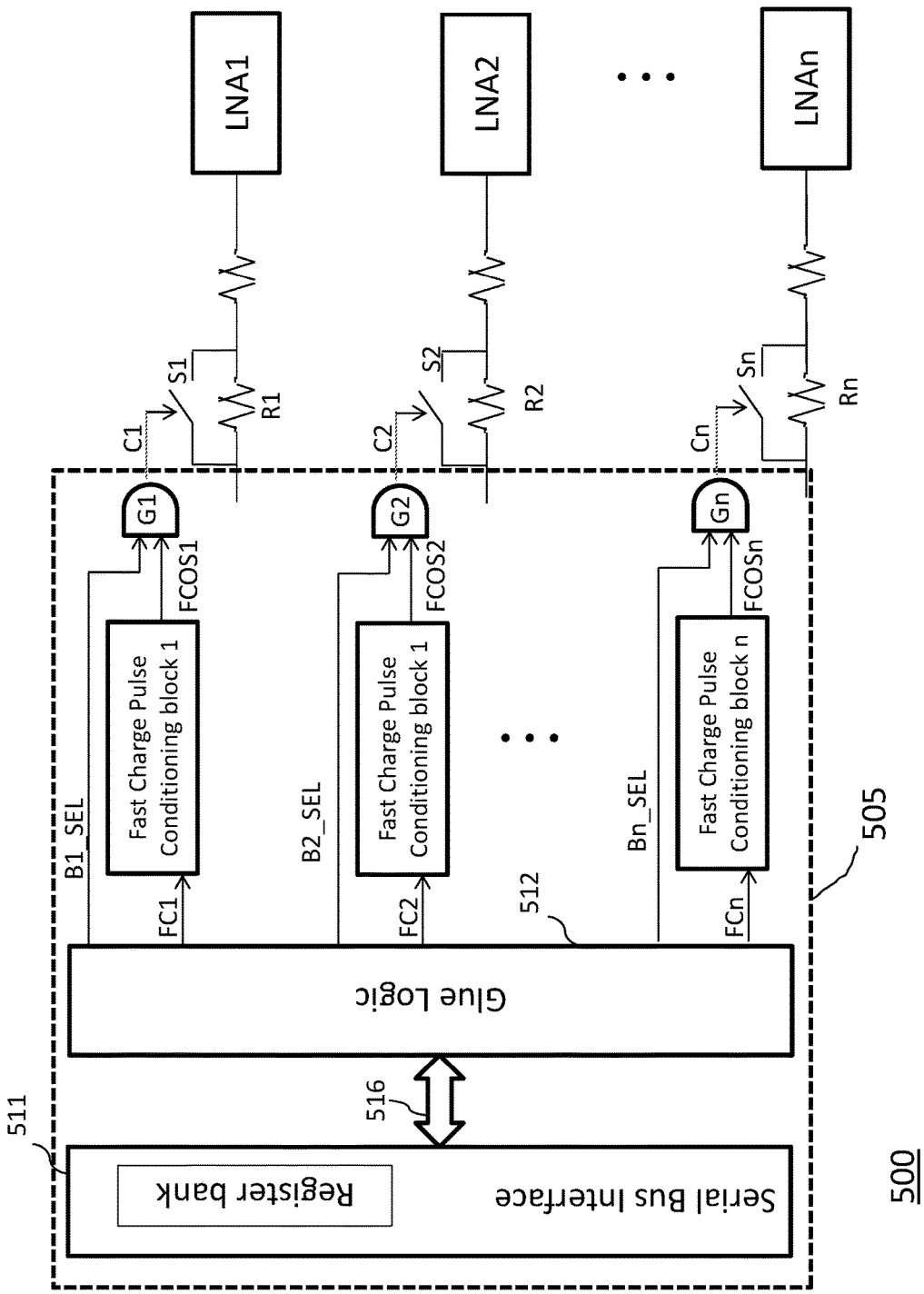
FIG. 5 shows a receiver module using several LNAs according to an embodiment of the disclosure.

FIG. 5 shows a receiver 500 in accordance with an embodiment of the disclosure. The receiver 500 comprises a plurality of LNAs (e.g., LNA1, LNA2, . . . and LNAn) and a plurality of bias series resistors (R1, R2, . . . and Rn). Each bias series resistor of the plurality of the bias series resistors is coupled with a corresponding LNA of the plurality of LNAs. The receiver 500 further comprises a plurality of switches (e.g., S1, S2, . . . Sn), each switch of the plurality of the switches being coupled across a corresponding bias series resistor of the plurality of the bias series resistor. A switching control logic 505 in accordance with present disclosure is also shown in FIG. 5. The switching control logic 505 comprises a glue logic 512, the glue logic 512 comprising a plurality of FC buses (e.g., FC1, FC2, . . . and FCn) and a plurality of LNA select buses (e.g., B1_SEL, B2_SEL, . . . and Bn_SEL). The glue logic 512 is connected with the serial bus interface 511 via a serial bus 516 and further comprises a plurality of FC buses (e.g., FC1, FC2, . . . and FCn). The switching control logic 505 further comprises a plurality of logic blocks (e.g., G1, G2, . . . and Gn) and a plurality of FCPCBs (e.g., FCPCB1, FCPCB2, . . . and FCPCBn), each FCPCB of the plurality of FCPCBs being connected with the glue logic 512 through a corresponding FC bus of the plurality of FC buses. The plurality of FCPCBs further comprises a plurality of FCOS buses (e.g., FCOS1, FCOS2, . . . and FCOSn). The plurality of logic boxes comprises a plurality of control output buses (e.g., C1, C2, . . . and Cn), the control output buses being connected with corresponding switches of the plurality of switches.

With further reference to FIG. 5 and in an operative condition, one or more LNAs of the plurality of LNAs may be in selected state, each selected LNA experiencing different transitions corresponding to, for example, a band and/or a gain state and/or a bias state change. Referring to FIG. 5 and similar to what was described with regards to FIG. 3, transactions from one steady state to another related to LNAs of the plurality of LNAs correspond to serial but interface transactions. Upon each of such transactions, signals on the plurality of FC buses are all asserted and as a result, each of the plurality of FCPCBs will generate a corresponding FCOS pulse on a corresponding FCOS bus of the plurality of FCOS buses. However, a generated FCOS pulse will be passed to a corresponding output bus only if a corresponding LNA is in transition between steady states. By way of example, if LNA2 is active, the corresponding bus select B2_SEL is in a TRUE state. As a result, the corresponding logic box G2 will allow an FCOS pulse generated on the FCOS2 bus to be passed to the control output C2. Therefore, switch S2 will close and an accelerated transition of LNA2 will be achieved in the same way as described previously. The same concept applies no matter how many of the LNAs of the plurality of LNAs are experiencing transitions. With further reference to FIG. 5 and in a similar way as described with regards to FIG. 3, all the signals on the FC buses will be de-asserted upon a following serial bus interface transaction. According to some embodiments of the disclosure, signals may also be gated at the plurality of the FC buses (e.g., FC1, FC2, . . . and FCn), thus preventing the rising edges from reaching the FCPCBs, thereby providing the FCOS signal only to the LNAs that may need such signal.

Figure 6:
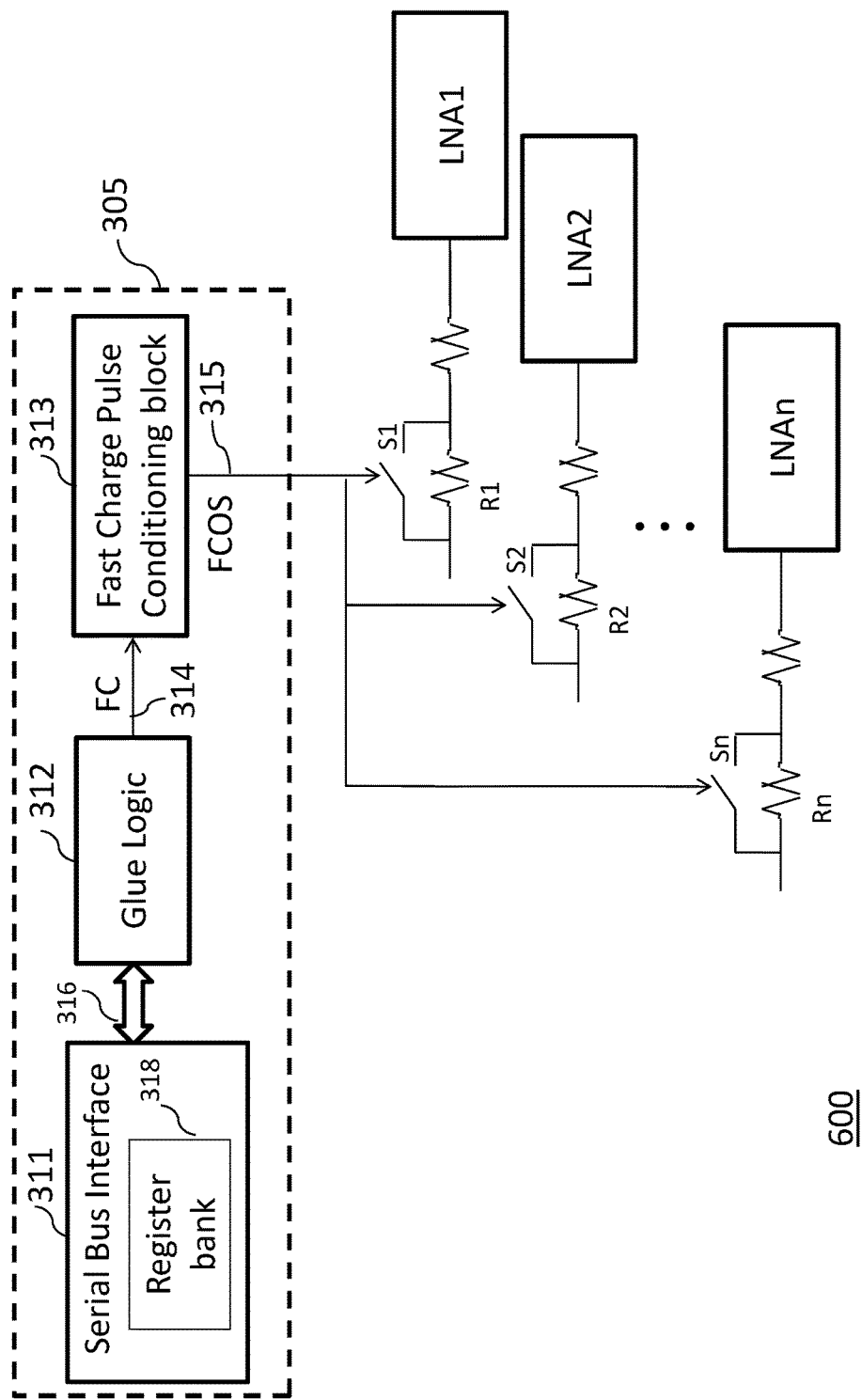
FIG. 6 shows a receiver module using several LNAs according to a further embodiment of the disclosure.

FIG. 6 shows a receiver 600 according to an embodiment of the present disclosure. The principle of operation of the receiver 600 is very similar to what was explained with regards to the receiver 500 of FIG. 5. The only difference is that in the case of the receiver 600, in an operative condition only one LNA may be ON at any one time but multiple LNAs can be transitioning: one to ON and others to OFF. As such and referring back to FIG. 6, the receiver 600 comprises only one FC bus (e.g., FC bus 614). In a similar way as described before, upon a relevant serial bus interface transaction, a signal on the FC bus 614 is asserted and an FCOS pulse hitting a plurality of switches (e.g., S1, S2, . . . and Sn) is generated. In other words, the FCOS pulse is asserting the present gate bias for all LNAs, whatever it is for each LNA, changed or unchanged. As a result, both switching times ON to OFF and vice versa will be reduced in a similar way as described before. It is noted that in this case where only one LNA is powered-on at a time, the assertion of the FCOS for unpowered LNA is harmless. Some embodiments in accordance with the present disclosure may implement this for the sake of simplifying circuitry and glue logic. The signal on the FC bus 614 is then de-asserted upon occurrence of a following serial bus interface transaction.

Figure 7:
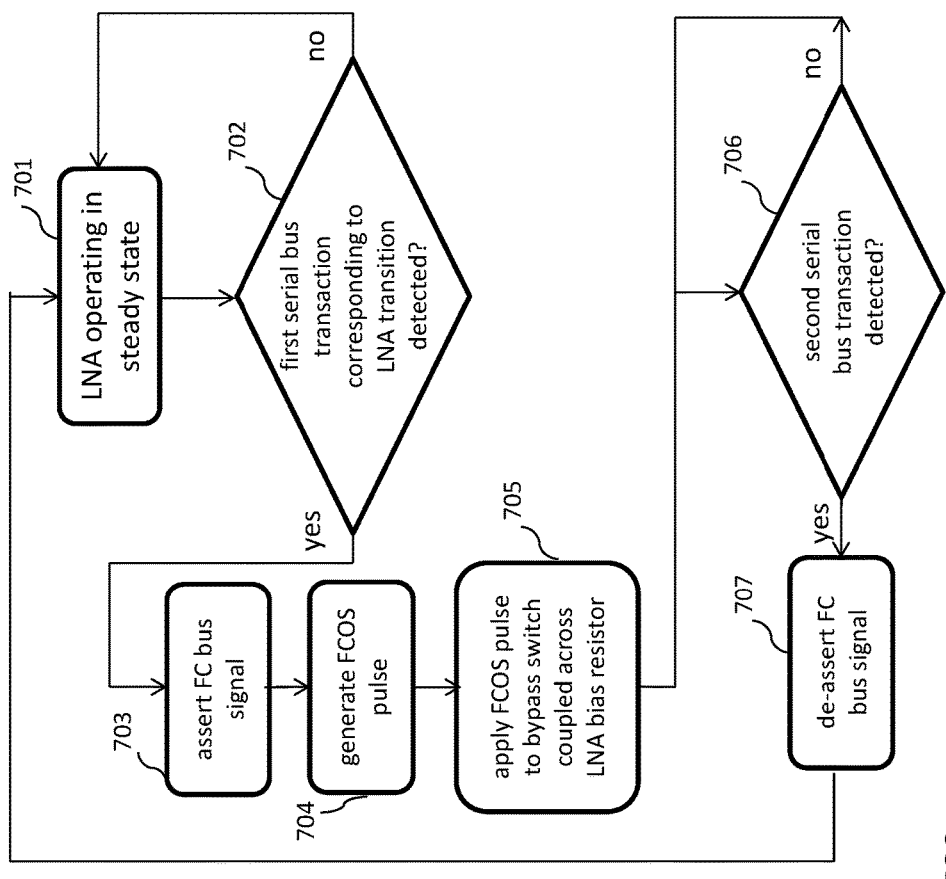
FIG. 7 shows a flowchart representing sequential steps of a method of generating a pulse to switch an LNA in accordance with an embodiment of the present disclosure.

FIG. 7 shows a flowchart 700 representing sequential steps of a method of generating an FCOS pulse to switch an LNA in accordance with the teachings of the present disclosure. As shown in a step 701 of the flowchart 700, the LNA is assumed to be in a steady state. In a similar way as what was described with reference to FIG. 3 and referring to steps 702-703 of the flowchart 700 of FIG. 7, when a serial bus transaction corresponding to an LNA transition is detected, the LNA begins transitioning into its new steady state and the FC signal is asserted to speed the LNA transition. As a result of asserting the signal on the FC bus, the FCOS pulse is generated (step 4) and in a next step 5 the FCOS pulse is applied to close the switch across the LNA bias resistor to achieve a faster LNA transition. As shown in steps 6-7, the FC bus signal is de-asserted upon detection of a second serial bus transaction after which the steps 1-7 will repeat in a similar manner.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion. It is to be understood that the foregoing description is intended to illustrate and not to limit the scope of the invention, which is defined by the scope of the following claims, and that other embodiments are within the scope of the claims.

What is claimed is:

1. A switching control logic comprising:
    a serial bus interface, the serial bus interface comprising an interface bus;
    a glue logic, the glue logic comprising a fast charge (FC) bus, and
    a fast charge pulse conditioning block (FCPCB), the FCPCB comprising a fast charge one shot (FCOS) bus;
    wherein:
        the glue logic is connected with the serial bus interface via the interface bus;
        the glue logic is connected with the FCPCB via the FC bus, and
        the FC bus is configured such that a first serial bus interface transaction will assert a signal on the FC bus, thereby generating a fast charge one shot (FCOS) pulse with a pulse width 'T1' on the FCOS bus, and a second serial bus interface transaction following the first serial bus interface transaction will de-assert the signal on the FC bus.

2. The switching control logic of claim 1, wherein the pulse width is within a range of 600 ns to 800 ns.

3. The switching control logic of claim 1, wherein the pulse width is less than or equal to 1 usec.

4. The switching control logic of claim 1, wherein the serial bus interface is a Mobile Industry Processor Interface.

5. The switching control logic of claim 1, wherein the serial bus interface comprises a plurality of registers and wherein the first transaction and the second transaction correspond to changes in values of one or more registers of the plurality of registers.

6. A radio frequency (RF) receiver comprising:
    the switching control logic of claim 1;
    a low noise amplifier (LNA) connected with a series arrangement of a first resistor and a second resistor, wherein the LNA is configured to receive a bias voltage through the series arrangement of the first resistor and the second resistor, and
    a switch coupled across the first resistor;

wherein:
the switch is connected with the FCOS bus;
the switch is configured to be open when the LNA is in a steady state;
the first serial bus interface transaction corresponds to an LNA transition from a first steady state to a second steady state, and
the switching is configured such that during the LNA transition from the first steady state to the second steady state, the FCOS pulse closes the switch for a duration equal to the pulse width, thereby bypassing the first resistor and reducing a switching time of the LNA.

7. The RF receiver of claim 6, wherein the LNA transition from the first steady state to the second steady state corresponds to one of a i) change of gain state ii) change of bias state iii) change of frequency band.

8. The RF receiver of claim 6, wherein the pulse width is within a range of 600 ns to 800 ns.

9. The RF receiver of claim 6, wherein the pulse width is less than or equal to 1 usec.

10. The RF receiver of claim 6, wherein the serial bus interface is a Mobile Industry Processor Interface.

11. The RF receiver of claim 6, wherein the serial bus interface comprises a plurality of registers and wherein the first transaction and the second transaction correspond to changes in values of one or more registers of the plurality of registers.

12. A switching control logic comprising:
(a) a serial bus interface, the serial bus interface comprising an interface bus;
(b) a glue logic, the glue logic comprising a plurality of fast charge (FC) buses and a plurality of select buses;
(c) a plurality of fast charge pulse conditioning blocks (FCPCB), the plurality of FCPCBs comprising a plurality of fast charge one shot (FCOS) buses, and
(d) a plurality of logic blocks, the plurality of logic blocks comprising a plurality of control output buses;
wherein:
(e) the glue logic is connected with the serial bus interface via the interface bus;
(f) the glue logic is connected with each of the plurality of FCPCBs via a corresponding FC bus of the plurality of FC buses;
(g) each of the plurality of logic boxes are connected with the glue logic via a corresponding select bus of the plurality of select buses;
(h) the plurality of logic boxes is connected with corresponding FCPCBs via corresponding FCOS buses;
(i) the plurality of FC buses are configured such that a first serial bus interface transaction will assert signals on the plurality of FC buses, thereby generating an FCOS pulse having a pulse width within a desired pulse width range on each of the plurality of FCOS buses, and a second serial bus interface transaction following the first serial bus interface transaction will de-assert the signals on the plurality of FC buses, and
(j) if a select bus of the plurality of select buses is in a TRUE state, the corresponding control logic box of the plurality of the control logic boxes is configured to pass a corresponding FCOS pulse to a corresponding control output bus of the plurality of the control output buses.

13. The switching control logic of claim 12, wherein the desired pulse width range is from 600 ns to 800 ns.

14. The switching control logic of claim 12, wherein the desired pulse width is less than or equal to 1 usec.

15. The switching control logic of claim 12, wherein the serial bus interface is a Mobile Industry Processor Interface.

16. The switching control logic of claim 12, wherein the serial bus interface comprises a plurality of registers and wherein the first transaction and the second transaction correspond to changes in values of one or more registers of the plurality of registers.

17. An RF receiver comprising:
the switching control logic of claim 12;
a plurality of LNAs coupled with corresponding bias series resistor of a plurality of bias series resistor, wherein the plurality of LNAs are configured to receive corresponding bias voltages via the corresponding bias series resistors of the plurality of bias series resistors, and
a plurality of switches coupled across corresponding bias series resistors of the plurality of bias series resistors;
wherein:
the plurality of control output buses are connected with corresponding switches of the plurality of switches;
the plurality of switches are configured to be open when corresponding LNAs of the plurality of LNAs are in a steady state;
select buses of the plurality of select buses are configured to be in TRUE state only if corresponding LNAs of the plurality of LNAs are in transition from one steady state to another steady state;
the first serial bus interface transaction corresponds to a transition of an LNA of the plurality of LNAs from a first steady state to a second steady state, and
the plurality of switches are configured such that during the transition of the LNA of the plurality of LNAs from the first steady state to the second steady state, a corresponding FCOS pulse having a pulse width 'T' within the desired pulse width range, closes the switch corresponding to the LNA of the plurality of LNAs for a duration equal to the pulse width 'T', thereby bypassing the corresponding bias resistor of the plurality of bias resistors and reducing a switching time of the LNA of the plurality of LNAs.

18. The RF receiver of claim 17, wherein the transition of the LNA of the plurality of LNAs from the first steady state to the second steady state corresponds to one of a i) change of gain state ii) change of bias state iii) change of frequency band.

19. The RF receiver of claim 17, wherein the desired pulse width range is from 600 ns to 800 ns.

20. The RF receiver of claim 17, wherein the desired pulse width range is less than or equal to 1 usec.

21. The RF receiver of claim 14, wherein the serial bus interface is a Mobile Industry Processor Interface.

22. The RF receiver of claim 17, wherein the serial bus interface comprises a plurality of registers and wherein the first transaction and the second transaction correspond to changes in values of one or more registers of the plurality of registers.

23. An RF receiver comprising:
the switching control logic of claim 1;
a plurality of LNAs coupled with corresponding bias series resistor of a plurality of bias series resistor, wherein the plurality of LNAs are configured to receive corresponding bias voltages via the corresponding bias series resistors of the plurality of bias series resistors, and
a plurality of switches coupled across corresponding bias series resistors of the plurality of bias series resistors;

wherein:
the FCOS bus is connected with the plurality of switches;
the plurality of switches are configured to be open when corresponding LNAs of the plurality of LNAs are in steady state;
only one LNA of the plurality of LNAs is active at a time;
the first serial bus interface transaction correspond to a transition of an LNA of the plurality of LNA from a first steady state to a second steady state, and
the switch is configured such that during the LNA transition from the first steady state to the second steady state, the FCOS pulse closes the switch corresponding to the LNA of plurality of LNAs for a duration equal to the pulse width, thereby bypassing the first resistor and reducing a switching time of the LNA of the plurality of LNAs.

24. The RF receiver of claim 19, wherein the transition of the LNA of the plurality of LNAs from the first steady state to the second steady state corresponds to one of a i) change of gain state ii) change of bias state iii) change of frequency band.

25. The RF receiver of claim 23, wherein the pulse width 'T1' is within a range of 600 ns to 800 ns.

26. The RF receiver of claim 23, wherein the pulse width 'T1' is less than or equal to 1 usec.

27. The RF receiver of claim 23, wherein the serial bus interface is a Mobile Industry Processor Interface.

28. The RF receiver of claim 23, wherein the serial bus interface comprises a plurality of registers and wherein the first transaction and the second transaction correspond to changes in values of one or more registers of the plurality of registers.

29. A method of generating a fast charge one shot (FCOS) pulse, the method comprising the steps of:
providing a serial bus interface;
providing a fast charge (FC) bus;
generating a first serial bus interface transaction;
detecting the first serial bus interface transaction;
asserting a signal on the FC bus upon detecting the first serial bus interface transaction;
generating the FCOS pulse upon asserting the signal on the FC bus;
generating a second serial bus interface transaction;
detecting the second serial bus interface transaction, and
de-asserting the signal on the FC bus upon detection of the second serial bus interface transaction.

30. The method of generating an FCOS pulse of claim 29, wherein a pulse width of the FCOS pulse is within a range from 600 ns to 800 ns and wherein the serial bus interface is a Mobile Industry Processor Interface.

31. The method of generating an FCOS pulse of claim 29, wherein a pulse width of the FCOS pulse is less than or equal to 1 usec and wherein the serial bus interface is a Mobile Industry Processor Interface.

32. An amplifier switching method comprising the steps of:
providing an amplifier coupled with a series bias resistor;
coupling a switch across the series bias resistor;
providing a bias voltage to the amplifier via the series bias resistor;
using the method of generating an FCOS pulse of claim 29 to generate the FCOS pulse, wherein the first serial bias transaction corresponds to a transition of the amplifier from a first steady state to a second steady state;
configuring the switch to close when the FCOS pulse is applied to the switch and configuring the switch to be open when the amplifier is in a steady state;
applying the FCOS pulse to close the switch when the amplifier is transitioning from the first steady state to the second steady state, thereby bypassing the series bias resistor and reducing a switching time of the LNA.

* * * * *